April 26, 1966 P. BAUER 3,247,861

FLUID DEVICE

Filed Nov. 20, 1963

INVENTOR

PETER BAUER

BY Griffin and Stokes

ATTORNEYS

United States Patent Office 3,247,861
Patented Apr. 26, 1966

3,247,861
FLUID DEVICE

Peter Bauer, Germantown, Md., assignor to Sperry Rand Corporation, New York, N.Y., a corporation of Delaware Filed Nov. 20, 1963, Ser. No. 325,124
11 Claims. (Cl. 137—81.5)

The present invention relates to pure fluid oscillators and more particularly, to pure fluid oscillators employing vortex amplifiers of the type disclosed in my copending application, Serial No. 135,824, filed September 5, 1961 and now matured into U.S. Patent No. 3,192,938 issued on July 6, 1965.

An object of this invention is to provide an oscillator for periodically producing fluid pulses at one or more outputs, said oscillator having no moving parts other than the fluid working medium.

More specifically, an object of this invention is to provide an oscillator employing an amplifier having an interaction chamber shaped to provide positive feedback whereby a first portion of the power stream is directed against itself thus tending to maintain the power stream in one of two stable states of flow, said oscillator further including means connecting the outputs of said amplifier to the control signal inputs thereof whereby a further portion of said power stream acts against said power stream in a direction tending to change its state of flow.

Another object of the invention is to provide a fluid oscillator employing the vortex principle and having a configuration of channels and chambers such that cross-overs are not required and all channels and chambers may be formed in the face of one substantially flat plate. This is accomplished through the provision of a vortex amplifier having two vortex chambers whereby a power stream entering said amplifier along a given axis crosses that axis at least twice before leaving the amplifier. The amplifier is provided with two output channels which are disposed substantially perpendicular to the axis of the power stream entering the amplifier and two feedback channels connect these output channels to the upstream vortex chamber for the purpose of deflecting the power stream.

A further object of the invention is to provide a fluid vortex amplifier having two vortex chambers whereby an applied fluid input signal causes a fluid output signal to be produced, said output signal flowing in the same direction as the input signal. This differs from vortex amplifiers heretofore known wherein the output signal flows in the opposite direction from the control signal. This feature is especially useful in many instances because it eliminates cross-overs of fluid channels and thus reduces fabrication costs.

Other objects of the invention and its mode of operation will become apparent upon consideration of the following description and the accompanying drawings in which.

Figure 1:
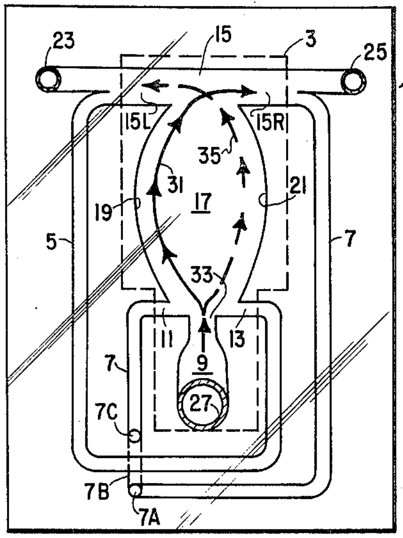
FIGURE 1 shows a pure fluid oscillator employing a conventional fluid vortex amplifier.
Figure 2:
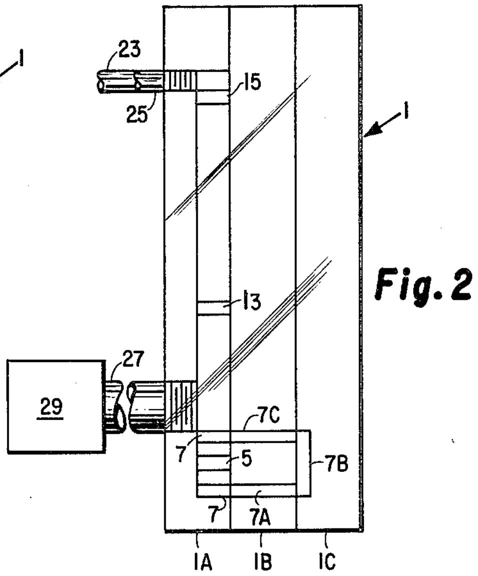
FIGURE 2 is a side view of the oscillator shown in FIGURE 1.

Turning now to FIGURES 1 and 2, a first embodiment of my novel oscillator comprises a substantially solid body 1 having formed therein a fluid vortex amplifier 3 and first and second feedback channels 5 and 7.

The vortex amplifier comprises a power stream input nozzle 9, first and second control signal input nozzles 11 and 13, and an output channel 15, all connecting with an oval-shaped vortex chamber 17 having a left side wall 19 and a right side wall 21. Output channel 15 intersects chamber 17 substantially tangentially to the curvature of walls 11 and 13 at their downstream extent. Channel 15 has a first section 15L connected to a pipe or other fluid conveying means 23 and feedback channel 5 interconnects 15L with control nozzle 13. Output channel 15 has a second section 15R connected to a pipe or other fluid conveying means 25 and feedback channel 7 interconnects 15R with control nozzle 11. A pipe or other fluid conveying means 27 conveys fluid from a fluid source 29 to the power stream nozzle. Source 29 may be a pump, compressor or any other suitable means for supplying fluid and preferably includes pressure regulating means of conventional design so that fluid is supplied to the power stream nozzle at a substantially constant rate.

The body 1 may comprise three substantially flat plates 1A, 1B, and 1C. The plates may be of plastic, ceramic, metallic or other material. In order to more clearly illustrate the interior channel and chamber configurations the plates are illustrated as being made of a clear plastic. The channels and chambers may be molded, etched, drilled, cut or otherwise formed in the plates.

FIGURE 2 shows a typical arrangement of the channels and chambers in the plates. All of the channels and chambers with the exception of a portion of channel 7 are formed in one face of plate 1A. Holes are drilled through the plate to communicate with nozzle 9 and output channels 15L and 15R and these holes are threaded to receive the pipes 27, 23 and 25, respectively.

As shown in FIGURE 1, feedback channel 7 must cross channel 5. The channels cannot intersect so a portion of channel 7 is routed around channel 5 at the cross-over point. Holes 7A and 7C are formed in plate 1B and each hole extends completely through the plate. A channel 7B is formed in one face of plate 1C, this channel being positioned such that it forms a path from 7A to 7C when plate 1C is brought into fluid-tight relationship with plate 1B. The embodiment shown in FIGURES 1 and 2 functions as follows. Source 29 supplies fluid under pressure through pipe 27 to power nozzle 9. This fluid emerges from the power nozzle as a high velocity jet stream and, in the absence of any forces acting against it, flow in a straight line through vortex chamber 17 to output chamber 15, dividing equally so that one-half flows into channel 15L and the other half flows into channel 15R.

However, as explained in my aforementioned application any unbalanced force acting against the power stream causes the power stream to assume a path of flow along one or the other of walls 19 and 21 in which case the power stream flows into only one of the channels 15L or 15R. This unbalanced force may result from a fluid signal applied to the chamber from one of the nozzles 11 or 13 or it may result from the power stream itself if the chamber is not perfectly symmetrical.

Assume for purposes of illustration that a force acts against the right side of the power stream thus deflecting it toward wall 19. The power stream flows along wall 19 as indicated by arrows 31 and flows into output channel 15R. All of the power stream does not enter the output channel. The upper extremity of wall 21 directs a small portion of the power stream fluid back into the vortex chamber. This feedback fluid flows downwardly along wall 21 and across orifice 33 thus pushing the power stream toward wall 19. The fluid then flows upwardly and around in a clockwise direction thus creating a vortex flow in chamber 17 which tends to hold the power stream against wall 19. For a more complete description of this vortex flow reference may be had to my abovementioned copending application.

A part of the fluid flowing into channel 15R from the vortex chamber flows into pipe 25 and may be conveyed to an input utilization device (not shown) for the purpose of actuating the output device. The remaining part of the fluid flowing into channel 15R enters feedback channel 7. This fluid flows through channel 7 and control signal input nozzle 11 and enters the vortex chamber 17 as a control jet.

The size of channels 7 and 11 are chosen such that the momentum of the control jet is great enough to deflect the power stream issuing from nozzle 9 toward wall 21. That is, the channels are chosen such that the force exerted against the power stream by the control jet exceeds the force exerted against the power stream by the fluid flowing in the vortex. This unbalanced force deflects the power stream away from wall 19 and toward wall 21.

The power stream now flows upwardly along wall 21 and, generally speaking, enters output channel 15L as indicated by the directional arrows 35. A small portion of the power stream is again deflected back into the vortex chamber from the region where the chamber connects with the output channel. A small portion of the power stream is deflected by the upper extremity of wall 19 so that the fluid flows downwardly along wall 19, across orifice 33 and then upwardly thus setting up a counterclockwise vortex flow which tends to keep the power stream deflected so that it flows upwardly along wall 21.

That portion of the power stream entering channel 15L is divided into two parts. One part flows into pipe 23 and may be conveyed to an external utilization device to actuate the device.

The remaining part of the fluid entering channel 15L is directed into feedback channel 5 from whence it flows through control signal input nozzle 13 and into the vortex chamber. The fluid entering the chamber from control nozzle 13 strikes the power stream issuing from nozzle 9. The force exerted against the power stream by the fluid from the control nozzle is greater than the force exerted on the power stream by the counterclockwise vortex flow existing in the vortex chamber. As a result, the power stream issuing from nozzle 9 is deflected so that it again flows upwardly along wall 19 and into input channel 15R.

This completes one cycle of operation of the oscillator and the power stream is once again flowing along the same path as initially assumed. The oscillator continues to oscillate and repetitively cycles through similar cycles as long as a power stream issues from nozzle 9.

For purposes of explanation each cycle of the oscillator is divided into two phases designated phase A and phase B. Phase A is defined as that portion of a cycle during which the power stream flows into output channel 15R and produces a fluid output signal in pipe 25. Phase B is defined as that portion of a cycle during which the power stream flows into output channel 15L and produces a fluid output signal in pipe 23.

Phase A and phase B may be made of equal duration or one phase may be made to last longer than the other phase. The duration of phase A is determined by the length of time it takes a feedback signal to travel from output channel 15R through feedback channel 7 and control nozzle 11 to the vortex chamber. In like manner, the duration of phase B is determined by the length of time it takes a feedback signal to travel from output channel 15L through feedback channel 5 and control nozzle 13 to the vortex chamber. The length of time required for a fluid signal to traverse the feedback paths may be selected by proper choice of the lengths of the feedback paths and/or by inserting artificial fluid delays such as one or more fluid chambers in the feedback paths. For example, by making feedback channel 7 longer than channel 5, or by inserting one or more fluid chambers in channel 7, the duration of phase A may be made longer than the duration of phase B. The term "fluid delay" as used herein is intended to include the inherent delay encountered by a fluid signal in traversing a fluid channel as well as artificial delays caused by fluid chambers.

Those skilled in the art will recognize that the frequency of oscillation or the number of repetitive cycles completed per unit of time is dependent upon the total time delay encountered in both feedback channel 5 and feedback channel 7 and is roughly inversely proportional to the total delay time.

While the oscillator shown in FIGURE 1 is admirably suited for its intended purpose it does require special consideration during the manufacturing process. As explained above, all of the channels and chambers of the oscillator may be formed in substantially the same plane with the exception of one of the feedback channels (i.e. channel 7) which must be disposed out of this plane over a portion of its length so that it may cross over and not intersect the other feedback channel.

Figure 3:
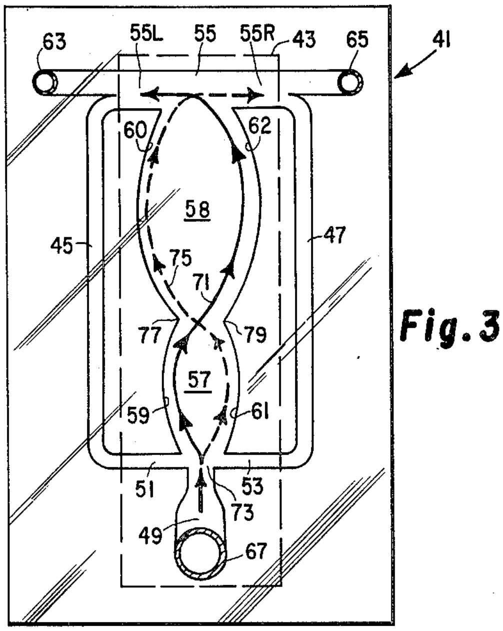
FIGURE 3 shows a pure fluid oscillator employing a fluid vortex amplifier having two vortex chambers; and, FIGURE 4 is a side view of FIGURE 3.

FIGURE 3 shows a second embodiment of the invention wherein all of the channels and chambers may, if desired, be disposed in a single plane. This enables fabrication costs to be reduced since all of the channels and chambers may be formed in the surface of one flat plate which is then covered with a second plate having no channel or chamber configuration formed thereon.

Figure 4:
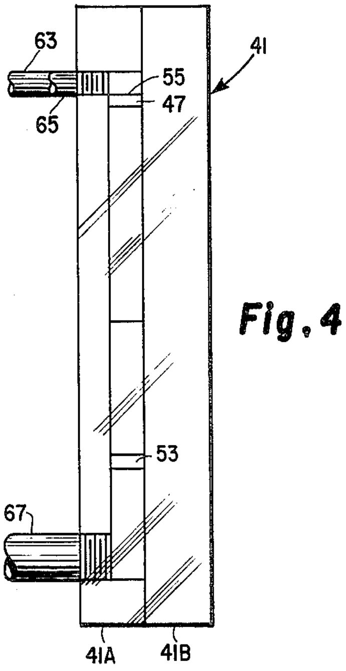

Referring now to FIGURES 3 and 4, a second embodiment of the invention comprises a substantially solid body 41 having formed therein a fluid vortex amplifier 43 and first and second feedback channels 45 and 47.

The vortex amplifier comprises a power stream input nozzle 49 and first and second control signal input nozzles 51 and 53 all connecting with a first oval-shaped vortex chamber 57 having a left side wall 59 and a right side wall 61. The amplifier further includes a second oval-shaped vortex chamber 58 having a left side wall 60 and a right side wall 62, said second vortex chamber being connected at its upstream extent with chamber 57 and at its downstream extent with an output channel 55. Thus, chambers 57 and 58 form a fluid passageway interconnecting the input and outputs. Output channel 55 has a first section 55L connected to a pipe or other fluid conveying means 63 and feedback channel 45 interconnects 55L with control nozzle 51. Output channel 55 has a second section 55R connected to a pipe or other fluid conveying means 65 and feedback channel 47 interconnects 55R with control nozzle 53. A pipe or other fluid conveying means 67 conveys fluid to the power stream nozzle from a source (not shown) which may be similar to source 29.

The body 41 may comprise two flat plates 41A and 41B. Plate 41B is a substantially solid plate which serves as a cover plate for the channel and chamber configuration formed in one face of plate 41A. Holes are drilled through plate 41A and tapped to receive pipes 63, 65, and 67 which are threaded.

The embodiment of FIGURE 3 operates in substantially the same manner as the embodiment previously described. The primary difference is that the second vortex chamber reverses the direction of fluid flow so that the power stream or output fluid leaving the amplifier flows in substantially the same direction as the control signal which caused the output.

Assume that a power stream is applied to power stream nozzle 49 and that the power stream flows along the path 71. A clockwise vortex flow is established in chamber 57 to hold the power stream against wall 59 and a counter-clockwise vortex flow is established in chamber 58 to hold the power stream against wall 62, each vortex being established in the manner described above.

A portion of the power stream entering output channel 55L is directed into pipe 63 and may be used as an output signal indicating that the oscillator is in phase B. The remainder of the power stream entering output channel 55L flows through feedback channel 45 and control nozzle 51 and emerges as a control jet which deflects the power stream entering chamber 57 through orifice 73 toward wall 61.

The power stream entering chamber 57 through orifice 73 now assumes a path of flow indicated by arrows 75. This state of flow is maintained by a clockwise vortex flow established in chamber 58 and a counter-clockwise flow established in chamber 57.

When the power stream assumes the path 75 and flows into output channel 55R a major portion of the power stream fluid flows into pipe 65 thus providing an indication that the oscillator is in phase A. The remaining portion of the power stream fluid enters feedback channel 47 and flows through control nozzle 63 thus entering chamber 57 as a control jet which deflects the power stream entering the chamber through orifice 73 toward wall 59.

When the power stream is deflected toward wall 59 it again assumes the path of flow indicated at 71. This completes one cycle of operation of the oscillator which continues to operate through similar cycles as long as a power stream is applied to nozzle 49.

The relative durations of phases A and B may be chosen as desired as explained with reference to the first embodiment. The duration of phase A is made longer as the delay in feedback channel 47 is increased. In like manner, the duration of phase B is increased as the transit time of a fluid signal through feedback channel 45 is increased.

It should be noted that in addition to being oval-shaped to thereby induce vortex flow the walls 59 through 62 should be shaped so that fluid leaving chamber 57 is directed along one wall of chamber 58. That is, fluid flowing upwardly along wall 61 should be flowing generally in the direction of point 77 as it leaves wall 61 so that a major portion of the fluid moves upwardly along wall 60 with a minor portion being deflected downwardly along wall 59 for the purpose of creating and sustaining vortex flow. In like manner, fluid flowing upwardly along wall 59 should be flowing generally in the direction of point 79 as it leaves wall 59 so that a major portion of the fluid moves upwardly along wall 62 with a minor portion being deflected downwardly along wall 61 for the purpose of creating and sustaining vortex flow. This may be accomplished by slightly "overlapping" the oval-shaped chambers.

The chamber 58 should be slightly larger than chamber 57 because of the intermixing of the high velocity power stream with the surrounding fluid thus producing a slower moving power stream of larger cross-sectional area.

While preferred embodiments of the invention have been shown and described herein, various substitutions and modifications falling within the spirit and scope of the invention as defined in the appended claims will be obvious.

The embodiments of the invention in which an exclusive property or privilege is claimed are defined as follows:

1. A pure fluid oscillator comprising: a fluid amplifier of the type having a first vortex chamber shaped to permit a whirling movement of fluid therein, said amplifier further including first and second control nozzles and a power nozzle for injecting a power stream into said chamber between said control nozzles; means defining a second vortex chamber shaped to permit a whirling movement of fluid therein, said second chamber intersecting said first chamber whereby a power stream may flow into said second chamber from said first chamber; an output channel intersecting said second chamber at a region intermediate the ends of said channel whereby fluid may flow into said channel from said second chamber in a first or a second direction; and fluid conducting means connecting said output channel with said first control nozzle and said second control nozzle whereby fluid flowing in a first direction in said output channel is applied to said first control nozzle and fluid flowing in a second direction in said output channel is applied to said second control nozzle.

2. A pure fluid oscillator as claimed in claim 1 wherein all of said channels, chambers, nozzles and fluid conducting means are coplanar.

3. A fluid oscillator comprising: a member having first and second chambers formed therein, each of said chambers having first and second opposing oval-shaped walls; means for injecting a power stream into said first chamber at the upstream extent of the first and second walls of said first chamber, said first and second chambers intersecting with an overlapping relationship at the upstream extent of the walls of said second chamber whereby a power stream flowing along the first wall of said first chamber is directed along the second wall of said second chamber with a portion of said power stream being deflected by the second wall of said first chamber to create a rotation of fluid flow in a given direction in said first chamber and a power stream flowing along the second wall of said first chamber is directed along the first wall of said second chamber with a portion of said power stream being deflected by the first wall of said first chamber to create a rotational fluid flow opposite to said given direction in said first chamber; an output channel intersecting said second chamber at its downstream extent, said second chamber connecting with said channel intermediate the ends of said channel whereby a power stream flowing along the first wall of said second chamber flows into said channel in a first direction and a power stream flowing along the second wall of said second chamber flows into said channel in a second direction; first and second openings disposed in the first and second walls, respectively, of said first chamber whereby fluid may be introduced into said chamber to deflect said power stream toward said second or said first wall of said chamber; first fluid conveying means for conveying a portion of the fluid flowing in said first direction from said output channel to said second opening; and second fluid conveying means for conveying a portion of the fluid flowing in said second direction to said first opening.

4. A fluid oscillator as claimed in claim 3 wherein said chambers, said fluid conveying means, and said output channels are disposed in a single plane.

5. A fluid oscillator comprising: power nozzle means for normally issuing a fluid power stream along a predetermined axis; first and second opposing control nozzles for selectively issuing control fluid to deflect said power stream from said predetermined axis; an output channel disposed downstream from said power nozzle and substantially perpendicular to said axis; means defining a fluid passageway, said passageway extending downstream from said power nozzle means and intersecting said output channel in a region intermediate its ends, said passageway being substantially symmetrical about said axis in the plane of said axis and said output channel and shaped to direct said power stream along a curvilinear path such that it twice crosses said axis before entering said output channel when said power stream is deflected from said axis by control fluid; first feedback channel means connecting said output with said first control nozzle; and second feedback channel means connecting said output channel and said second control nozzle.

6. A fluid device comprising: power nozzle means for normally issuing a fluid power stream along a predetermined axis; first means for issuing a first stream of control fluid in a first direction to deflect said power stream from said axis; second means for issuing a second stream of control fluid in a second direction to deflect said power stream from said axis; said power nozzle means, said first means and said second means being positioned relative to each other such that the fluid streams issued thereby flow in the same plane; a member having a fluid passageway therein, said passageway having opposing wall surfaces which are substantially symmetrical about said axis in the plane of said fluid streams and extending downstream from said power nozzle means, said opposing wall surfaces being shaped to direct said deflected power stream along a path whereby it twice crosses said axis after being deflected therefrom; output channel means intersecting said fluid passageway at its downstream extent for conveying power stream fluid away from said passageway, and wherein said fluid passageway comprises, upstream and downstream oval-shaped chambers which intersect with a slight overlap whereby a portion of a deflected power stream creates and maintains a vortex flow of fluid in said upstream chamber which maintains said power stream in its deflected path of flow.

7. A fluid device as claimed in claim 6 wherein said output channel means includes an output channel intersecting said downstream chamber substantially tangentially to the downstream extent of said chamber, said intersection being intermediate the ends of said output channel whereby fluid may flow from said downstream chamber into said output channel in a first or a second direction.

8. A fluid device as claimed in claim 7 wherein said first and second means for issuing streams of control fluid comprise first and second fluid conveying means each connected at one end to said output channel to receive fluid flowing through said output channel in a predetermined direction and terminating at an opening in said upstream chamber whereby control fluid issuing therefrom deflects said power stream from said axis.

9. A fluid device as claimed in claim 8 wherein said first fluid conveying means is connected to receive fluid flowing in said first direction and issue fluid into said upstream chamber in said second direction and said second fluid conveying means is connected to receive fluid flowing in said second direction and issue fluid flowing in said first direction.

10. A fluid device as claimed in claim 9 wherein said output channel, said first and second fluid conveying means and said chambers are all disposed in a single plane.

11. A fluid device as claimed in claim 10 wherein said downstream chamber is slightly larger than said upstream chamber.

References Cited by the Examiner

UNITED STATES PATENTS

| | | | |
|---|---|---|---|
| 3,024,805 | 3/1962 | Horton | 137—81.5 |
| 3,158,166 | 11/1964 | Warren | 137—81.5 |
| 3,177,888 | 4/1965 | Moore | 137—81.5 |
| 3,181,546 | 5/1965 | Boothe | 137—81.5 |

OTHER REFERENCES

"Fluid Logic Devices and Circuits," Mitchell et al., Transactions of the Society of Instrument Technology Feb. 26, 1963, p. 6, Figure 5. (I.B.M. publications file.) (Copy in Scientific Library.)

MARTIN P. SCHWADRON, *Acting Primary Examiner.*

M. CARY NELSON, *Examiner.*

S. SCOTT, *Assistant Examiner.*